(12) United States Patent
Andideh et al.

(10) Patent No.: US 7,091,615 B2
(45) Date of Patent: Aug. 15, 2006

(54) CONCENTRATION GRADED CARBON DOPED OXIDE

(75) Inventors: Ebrahim Andideh, Portland, OR (US); Mark Bohr, Aloha, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/084,638

(22) Filed: Mar. 18, 2005

(65) Prior Publication Data
US 2005/0161827 A1  Jul. 28, 2005

Related U.S. Application Data

(62) Division of application No. 09/943,874, filed on Aug. 31, 2001, now Pat. No. 6,887,780.

(51) Int. Cl.
*H01L 23/532* (2006.01)
(52) U.S. Cl. .................. 257/760; 257/E23.144; 257/E23.154
(58) Field of Classification Search .......... 257/760, 257/E23.144, E23.154
See application file for complete search history.

(56) References Cited

U.S. PATENT DOCUMENTS

| | | | |
|---|---|---|---|
| 5,872,401 A | 2/1999 | Huff et al. | |
| 6,068,884 A | 5/2000 | Rose et al. | |
| 6,077,764 A | 6/2000 | Sugiarto et al. | |
| 6,147,009 A | 11/2000 | Grill et al. | |
| 6,159,845 A | 12/2000 | Yew et al. | |
| 6,211,096 B1 | 4/2001 | Allman et al. | |
| 9,867,869 | 5/2001 | Andideh et al. | |
| 6,258,735 B1 | 7/2001 | Xia et al. | |
| 9,972,228 | 10/2001 | Andideh et al. | |
| 6,331,494 B1 | 12/2001 | Olson et al. | |
| 6,407,013 B1 | 6/2002 | Li et al. | |
| 6,410,462 B1 | 6/2002 | Yang et al. | |
| 6,423,630 B1 | 7/2002 | Catabay et al. | |
| 6,436,822 B1 | 8/2002 | Towle | |
| 6,440,876 B1 | 8/2002 | Wang et al. | |
| 6,441,491 B1 | 8/2002 | Grill et al. | |
| 6,482,754 B1 | 11/2002 | Andideh et al. | |
| 6,531,398 B1 | 3/2003 | Gaillard et al. | |
| 2001/0009295 A1* | 7/2001 | Furusawa et al. | 257/635 |
| 2001/0010970 A1 | 8/2001 | Uglow et al. | |
| 2001/0036723 A1* | 11/2001 | Torres et al. | 438/619 |
| 2002/0058405 A1* | 5/2002 | Huang et al. | 438/618 |
| 2002/0072221 A1* | 6/2002 | Nishimura et al. | 438/624 |
| 2003/0001240 A1* | 1/2003 | Whitehair et al. | 257/638 |
| 2003/0077921 A1 | 4/2003 | Andideh et al. | |
| 2003/0227090 A1* | 12/2003 | Okabe | 257/760 |
| 2004/0061235 A1* | 4/2004 | Barth et al. | 257/760 |

(Continued)

FOREIGN PATENT DOCUMENTS

EP   1 050 600 A1   11/2000

(Continued)

OTHER PUBLICATIONS

Search Report for PCT/US02/31525, mailed Jan. 22, 2003, 5 pages.

(Continued)

*Primary Examiner*—George Fourson
(74) *Attorney, Agent, or Firm*—Blakely, Sokoloff, Taylor & Zafman LLP

(57) ABSTRACT

A process for forming an interlayer dielectric layer is disclosed. The method comprises first forming a carbon-doped oxide (CDO) layer with a first concentration of carbon dopants therein. Next, the CDO layer is further formed with a second concentration of carbon dopants therein, wherein the first concentration is different than the second concentration.

7 Claims, 6 Drawing Sheets

U.S. PATENT DOCUMENTS

2004/0097068 A1 * 5/2004 Yuasa .......................... 438/624

FOREIGN PATENT DOCUMENTS

| EP | 1 050 601 A1 | 11/2000 |
|----|--------------|---------|
| EP | 1 077 477 A1 | 2/2001 |
| EP | 1 148 539 A2 | 10/2001 |
| EP | 1 195 451 A1 | 4/2002 |
| EP | 1 201 785 A1 | 5/2002 |
| WO | WO 99/38202 | 7/1999 |

OTHER PUBLICATIONS

D. Weber, et al., "Impact of substituting SIO ILD by low k materials into A/CU Rie metalization", Infineon Technologies AG, Konigsbruckersrafe 180, D-01099 Dresden. Gernamy, current address: Infineon technologies, Inc. IBM Semiconductor Research and Development Center, Hopewell Junction, NY 12533, USA, date unknown.

* cited by examiner

US 7,091,615 B2

CONCENTRATION GRADED CARBON DOPED OXIDE

The present patent application is a Divisional of application Ser. No. 09/943,874, filed Aug. 31, 2001, now U.S. Pat. No. 6,887,780.

BACKGROUND OF THE INVENTION

1. Field of the Invention

The present invention relates to low k dielectrics, and more particularly, to a carbon doped oxide having a carbon doping concentration that is graded.

2. Background Information

As integrated circuit technology advances, integrated circuit devices become smaller and smaller. This allows for greater speed and increased device packing densities. Sizes of individual features, for example the transistor gate length, on modern integrated circuits is shrinking to less than 50 nanometers. The resultant increase in packing densities has greatly increased the number and density of metal interconnects on each chip.

The metal interconnects (which consist of conducting lines and vias) have become smaller, more complex, and more closely spaced. The smaller sizes of the interconnect pitch leads to RC (resistance-capacitance) coupling problems which include propagation delays and cross talk noise between interlevel and intralevel conductors. RC delays thus limit improvement in device performance. Additionally, fringing electrical field effects near the metal lines may adversely affect performance of the interconnects.

Capacitance can be reduced by employing low dielectric constant (low k) dielectric materials to insulate the metal interconnect lines. Since capacitance is directly proportional to the dielectric constant of the insulating material, the RC delay can be reduced when a low k material is used. Various semiconductor equipment manufacturers have developed low k dielectrics. One of the most promising low k dielectrics is the carbon-doped oxide ($SiO_xC_yH_z$).

While carbon doped oxide (CDO) film has been found useful to reduce capacitance by lowering film density and polarizability of bonds, CDO film has poor thermal and mechanical properties. For example, CDO exhibits poor hardness, is susceptible to cracking, and has low thermal conductivity.

BRIEF DESCRIPTION OF DRAWINGS

The foregoing aspects and many of the intended advantages of this invention will become more readily appreciated as the same becomes better understood by reference to the following detailed description, when taken in conjunction with the accompanying drawings, wherein.

DETAILED DESCRIPTION OF THE INVENTION

The present invention describes a method for forming a carbon doped oxide (CDO) film having a graded concentration of carbon doping. In one embodiment, the CDO film is utilized for interlayer dielectric applications.

In the following description, numerous specific details are provided to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment", "preferred embodiment", or "an embodiment" means that a particular feature, structure, or characteristic described in connection with the embodiment is included in at least one embodiment of the present invention. Thus, the appearances of the phrases "in one embodiment", "in a preferred embodiment", or "in an embodiment" in various places throughout this specification are not necessarily all referring to the same embodiment. Furthermore, the particular features, structures, or characteristics may be combined in any suitable manner in one or more embodiments.

Figure 1:
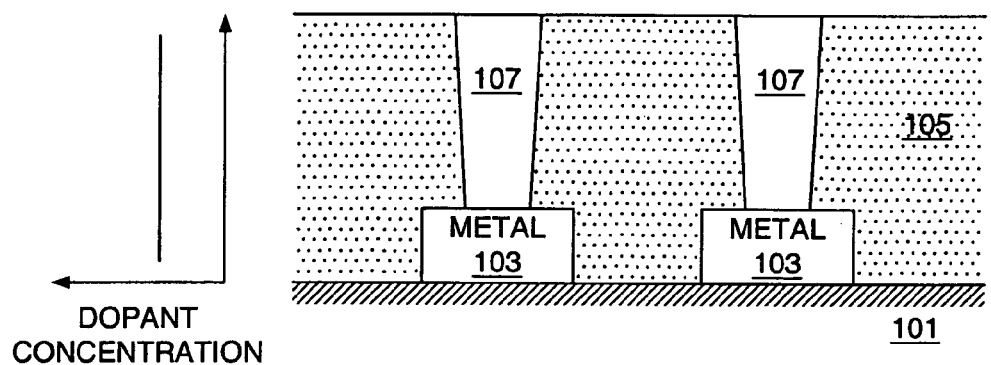
FIG. 1 is a schematic cross-section of a semiconductor substrate illustrating one use of a prior art carbon doped oxide film as an interlayer dielectric.

Turning to FIG. 1, in a typical application, a CDO layer 105 is deposited atop of a substrate 101. The term substrate 101 as used herein may include a semiconductor wafer, active and passive devices formed within the wafer, and layers formed on the wafer surface. Thus, the term substrate is meant to include devices formed within a wafer and layers that overlie the wafer. Further, the CDO layer 105 is formed over metal conducting structures (also referred to as a metal interconnect) 103 formed on the substrate 101. As noted above, the CDO layer 105 is especially useful for it's low k dielectric properties. Thus, it is useful in an intermetal or interlayer dielectric application to minimize capacitance between various segments of the metal interconnect 103.

Further, typically, the CDO layer 105 is patterned and etched in accordance with a desired via pattern. The carbon-doped oxide layer 105 is etched to form vias 107 in the carbon-doped oxide layer 105. In the prior art, the CDO layer 105 has a homogenous concentration of carbon dopants. This can be seen in FIG. 1, which includes a dopant concentration chart that shows the relative level of dopant concentration relative to the depth of the CDO layer 105. As seen, the dopant concentration is the same throughout the entire depth of the CDO layer 105.

In accordance with the present invention, the carbon dopant concentration is graded. Specifically, in those regions of the CDO layer 105 that are proximal to the metal interconnect 103, a high carbon dopant concentration is provided. This lowers the k value of the CDO layer. In those regions of the CDO layer 105 that are distal to the metal interconnect 103, e.g., between the vias 107, a relatively low carbon dopant concentration is provided. This increases the hardness and increases cracking resistance and thermal conductivity of the CDO layer 105.

Figure 2:
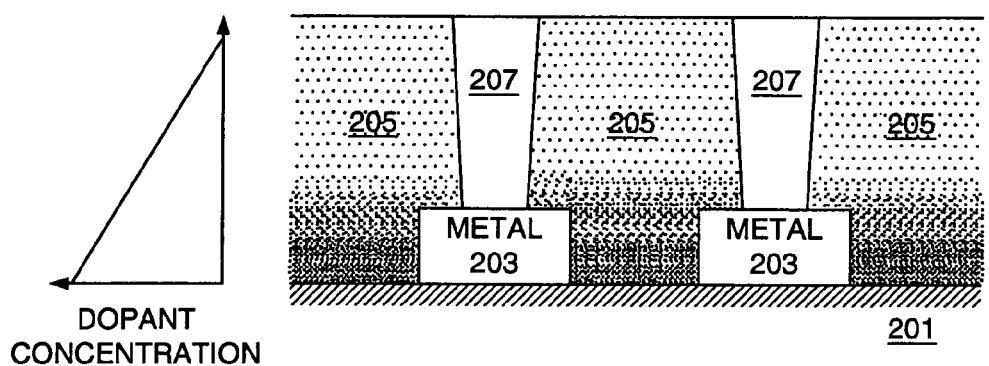
FIG. 2 is a schematic cross-section view of a semiconductor substrate illustrating a carbon doped oxide film formed in accordance with the present invention used as an interlayer dielectric.

Specifically, turning to FIG. 2, a CDO layer 205 has a graded concentration of carbon dopants. In this particular example, the dopant concentration is highest near the metal interconnect 203. Where the CDO layer 205 surrounds the vias 207, the carbon dopant concentration is less. Further, although the dopant concentration is shown to decrease linearly from bottom to top of the CDO layer 205 (referred to as a linear concentration profile), a discontinuous stepped decrease of carbon dopants is also contemplated to be in accordance with the present invention.

The advantage of such a CDO layer 205 is that proximal to the metal interconnect 203, a high carbon dopant concentration is present. This lowers the dielectric constant, thereby reducing electrical field fringe effects and capacitance. Proximal to the vias 207, where capacitance issues and fringe effects are not as pronounced, the carbon dopant concentration is lower. In the region proximal the vias 207, the CDO layer 205 has enhanced hardness, greater resistance to cracking, and greater thermal conductivity, relative to the CDO layer 205 proximal the metal interconnect 203.

The present invention can also be applied to dual damascene type structures. For example, turning to FIG. 3, a multilevel metal interconnect and via structure is shown. The first level of the metal interconnect includes a first metal layer (M1) 301 that has been deposited onto a substrate. Formed between the first metal layer M1 301 is a first dielectric layer 303. The first dielectric layer 303 may be, for example, a carbon doped oxide, a fluorine doped oxide, or the like. In accordance with dual damascene processes, a carbon doped oxide layer 305 is deposited above the first dielectric layer 303 and the first metal layer M1 301.

Figure 3:
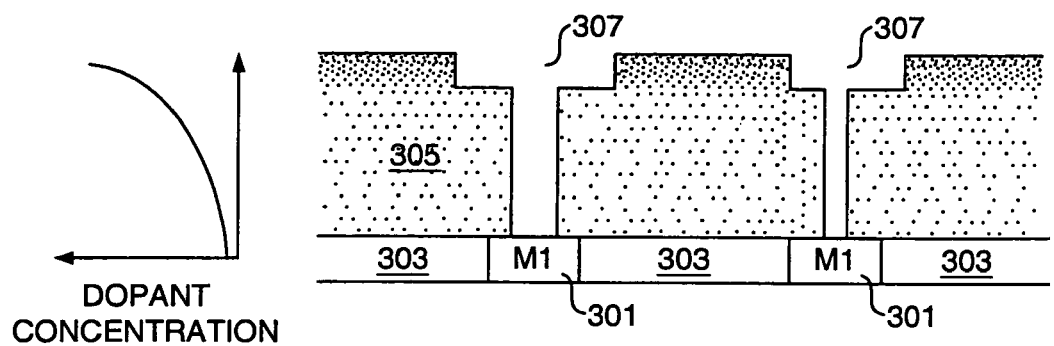
FIGS. 3–5 are schematic cross-section views of a semiconductor substrate illustrating a carbon doped oxide film formed in accordance with alternative embodiments of the present invention.

As seen in FIG. 3, for this dual damascene application, the carbon dopant concentration of the carbon doped oxide layer 305 progressively increases as the CDO layer 305 is deposited. Therefore, a lower concentration of carbon dopant is present during initial deposition of the CDO layer 305 and a higher carbon dopant concentration is provided near the completion of the CDO layer 305. After the CDO layer 305 is deposited, patterning and etching steps are performed to form dual damascene openings 307 formed in the CDO layer 305. Further, typically a second metal layer is deposited into the openings 307. In this manner, the via and the second metal layer can be deposited at the same time.

By having the lower carbon dopant concentration adjacent to the via portion of the opening 307, enhanced hardness, thermal conductivity, and resistance to cracking is provided. Note that in the upper region of the openings 307 (carrying the second metal interconnect structure), a higher carbon dopant concentration is provided. This reduces the dielectric constant and provides the advantages noted above. Thus, in this embodiment, the higher dopant concentration is near the surface of the CDO layer 305 and the lower concentration of dopant is provided near the bottom of the CDO layer 305.

Figure 4:
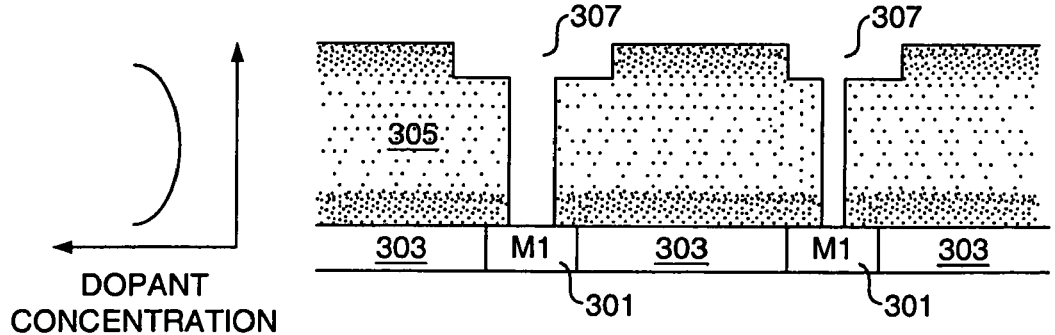

In an alternative embodiment, referring to FIG. 4, the CDO layer 305 includes a high dopant concentration initially, followed by a lower dopant concentration, finally followed by a high dopant concentration near the top of the CDO layer 305. This dopant concentration profile is helpful in reducing electric field fringe effects arising from the first metal layer M1 301. This dopant profile is referred to as a concave nonlinear dopant concentration.

Figure 5:
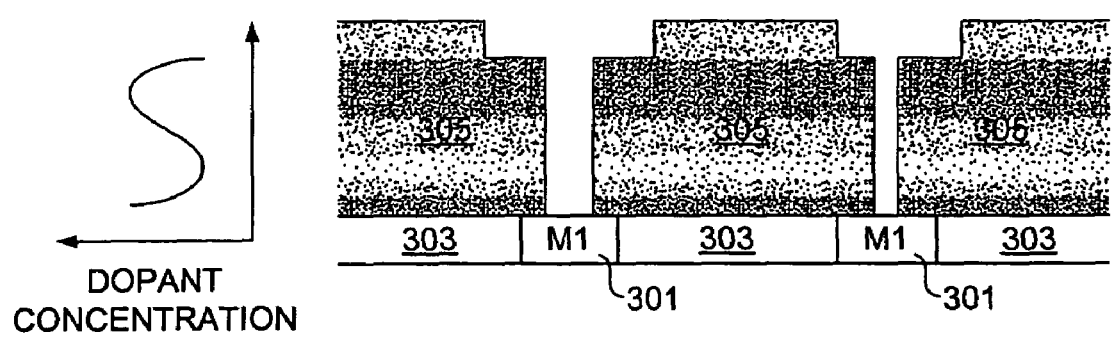

Still alternatively, referring to FIG. 5, the dopant concentration of carbon in the CDO layer 305 may be higher in the middle region of the CDO layer 305 compared to the top and bottom regions of the CDO layer 305. Thus, at the top of the first metal layer 301, a high carbon concentration is provided. This helps to reduce electric field fringe effects near the first metal layer 301. Next, moving upwards from the first metal layer 301 towards the second metal layer, the carbon concentration is lowered in the via region of the dual damascene layer. Then, the carbon concentration is increased as the second metal layer is approached. Finally, a low carbon concentration is provided near the top of the second metal layer. Indeed, the top of the carbon doped oxide may be almost completely depleted of carbon. This top layer can then be used as a hardmask for the CDO layer. This dopant profile is referred to as a convex nonlinear dopant concentration.

In one embodiment, the carbon dopant concentration ranges from 1–20% (by atomic mass) for the carbon dopant. Thus, for low carbon dopant concentration regions, 1% carbon dopant is provided. For high carbon dopant regions, up to and over 20% carbon dopant concentration may be used. However, it can be appreciated that other dopant concentrations may be used, customized for the specific application.

The formation of variably doped CDO is described in relation to FIGS. 6–9. While there are many methods of depositing carbon doped oxides, the amount of carbon dopant present in the carbon doped oxide can be varied by modulating the flow rate of the process gases, or by modulating the RF power, pressure and temperature in accordance with known techniques.

Figure 6:
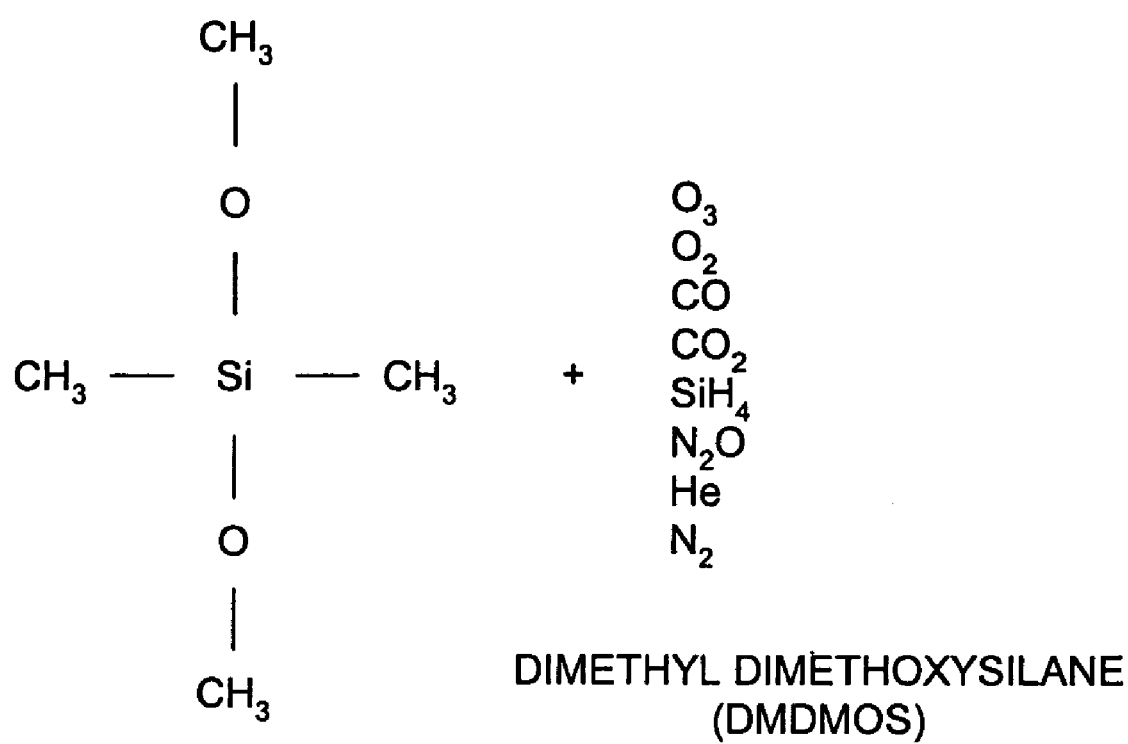
FIGS. 6–9 are schematic diagrams of chemical reactions suitable for forming carbon doped oxide.
Figure 7:
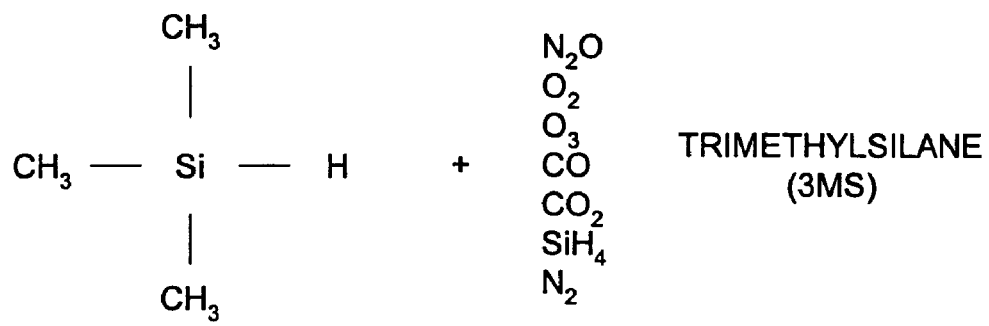
Figure 8:
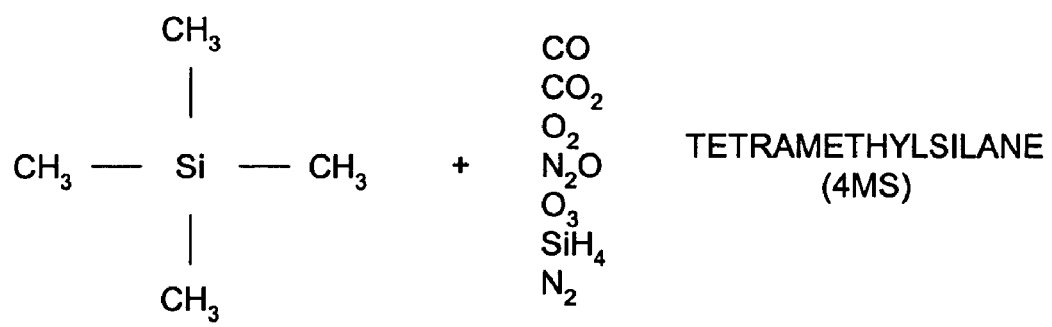
Figure 9:
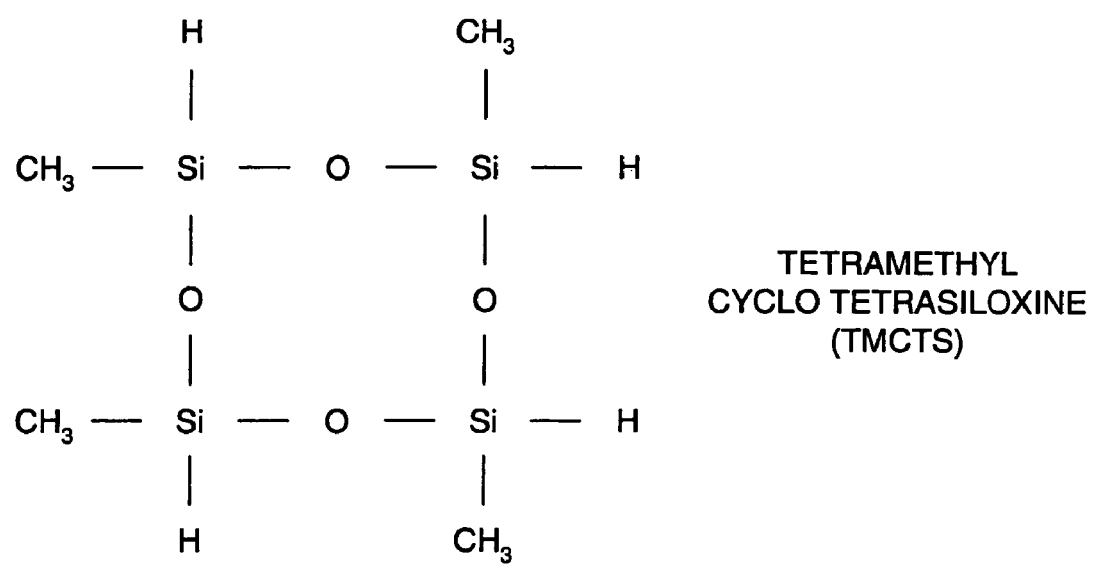

For example, turning to FIG. 6, the chemical reaction may constitute the flowing of dimethyldimethoxysilane (DMDMOS) with a diluting agent such as helium. By flowing these gasses into the process chamber with the application of energy to generate a plasma, a CDO layer can be formed. Alternatively, turning to FIG. 7, trimethylsilane (3MS) can be flowed into the process chamber with one of the following gasses: $N_o$, $O_2$, $O_3$, CO, or $CO_2$. This will also result in a CDO layer. Still alternatively, turning to FIG. 8, tetramethylsilane (4MS) can be flowed with any of the above oxygen containing gases to generate a carbon doped oxide layer. Still alternatively, tetramethylcyclotetrasiloxine (TM-CTS) may also be used to form the CDO layer. The resulting CDO layer from these processes has a chemical composition of $SiOC_xH_y$.

It should be noted that while four specific examples of gases that can be used to form the CDO layer have been described above, numerous other techniques may be used to form CDO. The present invention teaches that, contrary to the prior art, a CDO layer can be formulated having a variable carbon dopant concentration. While in one embodiment, the carbon dopant concentration can be varied in situ to improve throughput, as well as to provide a smooth transition between carbon dopant concentrations, discreet layers of CDO having varying carbon dopant concentrations may also be used to formulate a bulk interlayer dielectric. Moreover, the placement of the high and low carbon dopant concentrations is variable dependent upon the types of structures being formed and the types of capacitance and electrical fringing effects present. Thus, while specific examples of dopant concentration profiles have been provided, these dopant profiles are not meant to be limiting.

Thus, while several specific embodiments of the invention has been illustrated and described, it will be appreciated that various changes can be made therein without departing from the spirit and scope of the invention.

What is claimed is:

1. An interconnect structure, comprising:
   a metal structure formed on a substrate, the metal structure having a via and an interconnect and extending above a surface of the substrate;
   a first carbon-doped oxide (CDO) layer having a first concentration of carbon dopants disposed around the metal structure; and
   a second CDO layer formed above the first CDO layer and the metal structure, the second CDO layer having a second concentration of carbon dopants that is lower than the first concentration of carbon dopants, wherein the first CDO layer forms a hard mask.

2. The interconnect structure of claim 1, further comprising a third CDO layer formed above the second CDO layer, the third CDO layer having a third concentration of carbon dopants therein, wherein there is a linear correlation between the first concentration, the second concentration, and the third concentration.

3. The interconnect structure of claim 1, further comprising a third CDO layer formed above the second CDO layer, the third CDO layer having a third concentration of carbon dopants, wherein the first concentration and the third concentration of carbon dopants are each higher than the second concentration.

4. An interlayer dielectric comprising:
a carbon-doped oxide (CDO) layer having a first region with a first concentration of carbon dopants therein, a second region disposed on the first region and having a second concentration of carbon dopants therein, and a third region disposed on the second region and having a third concentration of dopants therein,
wherein the first and third concentrations are higher than the second concentration to reduce electric field effects.

5. An interlayer dielectric comprising:
a carbon-doped oxide (CDO) layer having a first region with a first concentration of carbon dopants therein, a second region disposed on the first region and having a second concentration of carbon dopants therein, and a third region disposed on the second region and having a third concentration of dopants therein,
wherein the first and third concentrations are lower than the second concentration to reduce electric field effects.

6. An interlayer dielectric comprising:
a carbon-doped oxide (CDO) layer having a first region with a first concentration of carbon dopants therein, a second region disposed on the first region and having a second concentration of carbon dopants therein, a third region disposed on the second region and having a third concentration of carbon dopants therein, and a fourth region disposed on the third region and having a fourth concentration of carbon dopants therein;
wherein the first and third concentrations are each higher than either of the second and fourth concentrations to reduce electric field effects.

7. An interlayer dielectric comprising:
a carbon-doped oxide (CDO) layer having a first region with a first concentration of carbon dopants therein, a second region disposed on the first region and having a second concentration of carbon dopants therein, a third region disposed on the second region and having a third concentration of carbon dopants therein, and a fourth region disposed on the third region and having a fourth concentration of carbon dopants therein; wherein the first and third concentrations are each lower than either of the second and fourth concentrations to reduce electric field effects.

* * * * *